(12) United States Patent
Kim et al.

(10) Patent No.: US 8,192,592 B2
(45) Date of Patent: Jun. 5, 2012

(54) METHODS OF FORMING A PHASE-CHANGE MATERIAL LAYER INCLUDING TELLURIUM AND METHODS OF MANUFACTURING A PHASE-CHANGE MEMORY DEVICE USING THE SAME

(75) Inventors: Do-Hyung Kim, Gyeonggi-do (KR);
Shin-Jae Kang, Gyeonggi-do (KR);
In-Sun Park, Gyeonggi-do (KR);
Hyun-Seok Lim, Gyeonggi-do (KR);
Gyu-Hwan Oh, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 1100 days.

(21) Appl. No.: 12/051,043

(22) Filed: Mar. 19, 2008

(65) Prior Publication Data

US 2008/0230373 A1    Sep. 25, 2008

(30) Foreign Application Priority Data

Mar. 21, 2007   (KR) .................. 10-2007-0027395

(51) Int. Cl.
*C23C 14/04* (2006.01)

(52) U.S. Cl. ........... 204/192.26; 204/192.2; 204/192.15; 204/192.12

(58) Field of Classification Search ............. 204/192.15, 204/192.16, 192.2, 192.26
See application file for complete search history.

(56) References Cited

U.S. PATENT DOCUMENTS

| | | | |
|---|---|---|---|
| 6,033,535 A * | 3/2000 | Ohno et al. ................. | 204/192.2 |
| 2001/0003641 A1 * | 6/2001 | Kunitomo et al. ........ | 430/270.13 |
| 2005/0115829 A1 * | 6/2005 | Yahagi et al. ............. | 204/298.13 |
| 2008/0173537 A1 * | 7/2008 | DeSteese et al. ........ | 204/192.25 |

FOREIGN PATENT DOCUMENTS

| | | |
|---|---|---|
| JP | 2004-311729 | 11/2004 |
| KR | 1020040076225 A | 8/2004 |
| KR | 453540 | 10/2004 |

* cited by examiner

*Primary Examiner* — Keith Hendricks
*Assistant Examiner* — Jason M Berman
(74) *Attorney, Agent, or Firm* — Myers Bigel Sibley & Sajovec, PA (57) ABSTRACT

The present invention provides methods of forming a phase-change material layer including providing a substrate and a chalcogenide target including germanium (Ge), antimony (Sb) and tellurium (Te) at a temperature wherein tellurium is volatilized and antimony is not volatilized, and performing a sputtering process to form the phase-change material layer including a chalcogenide material on the substrate. Methods of manufacturing a phase-change memory device using the same are also provided.

20 Claims, 9 Drawing Sheets

METHODS OF FORMING A PHASE-CHANGE MATERIAL LAYER INCLUDING TELLURIUM AND METHODS OF MANUFACTURING A PHASE-CHANGE MEMORY DEVICE USING THE SAME

CROSS-REFERENCE TO RELATED APPLICATION

This application claims the benefit under 35 U.S.C. §119 to Korean Patent Application No. 10-2007-0027395, filed on Mar. 21, 2007, the disclosure of which is incorporated herein by reference in its entirety.

FIELD OF THE INVENTION

Embodiments of the present invention relate to methods of forming a phase-change material layer including a chalcogenide material and methods of manufacturing a phase-change memory device using the same.

BACKGROUND OF THE INVENTION

Semiconductor memory devices may be generally divided into volatile semiconductor memory devices, such as dynamic random access memory (DRAM) devices or static random access memory (SRAM) devices, and non-volatile semiconductor memory devices, such as flash memory devices or electrically erasable programmable read-only memory (EEPROM) devices. The volatile semiconductor memory devices generally lose data stored therein when power is turned off. However, non-volatile semiconductor memory devices may maintain stored data even when the power supply is interrupted or turned off.

Among the non-volatile semiconductor memory devices, the flash memory devices have been employed in various electronic apparatus, such as digital cameras, cellular phones, MP3 players, etc. Because a flash memory device generally requires a relatively significant time for writing or erasing data, alternative technologies for manufacturing semiconductor memory devices, for example, a magnetoresistive random access memory (MRAM) device, a ferroelectric random access memory (FRAM) device or a phase-change random access memory (PRAM) device, have been developed.

In a PRAM device, data may be input or output using a resistance difference between an amorphous state and a crystalline state of a phase-change material layer including a chalcogenide material, for example, germanium-antimony-tellurium (Ge—Sb—Te) (GST). Particularly, data having a value of "0" or "1" may be stored in the PRAM device using a reversible phase transition of the phase-change material layer. The phase-change material layer in the amorphous state may have a relatively increased resistance, whereas the phase-change material layer in the crystalline state may have a relatively decreased resistance. In the PRAM device, a transistor may provide the phase-change material layer with a reset current for changing the phase of the phase-change material layer from a crystalline state into an amorphous state. The transistor may also supply the phase-change material layer with a set current for changing the phase of the phase-change material layer from an amorphous state into a crystalline state. The phase-change material layer may be formed on a lower electrode making contact with a plug electrically connected to the transistor. Conventional PRAM devices and methods of manufacturing conventional PRAM devices are discussed in U.S. Pat. No. 5,825,046, U.S. Pat. No. 5,596,522, Korean Laid-Open Patent Publication No. 2005-31160 and Korean Patent No. 437458, for example.

In the methods of manufacturing conventional PRAM devices discussed above, a phase-change material layer including GST may be formed by a physical vapor deposition (PVD) process such as a sputtering process or a chemical vapor deposition (CVD) process. However, in the PVD process, controlling the composition ratio of GST may be difficult so that the phase-change material layer may not possess desirable electrical characteristics.

Particularly, GST is a pseudobinary compound, which includes germanium telluride (GeTe) and antimony telluride ($Sb_2Te_3$), having a chemical formula of germanium-antimony-tellurium ($Ge_xSb_yTe_{(100-x-y)}$). Here, x and y may not have arbitrary values under 100, where GST has a composition ratio on a pseudobinary line that connects germanium telluride (GeTe) and antimony telluride ($Sb_2Te_3$) in a pseudobinary phase diagram, and the composition ratio may have only an acceptable error range of 10% (See IEE Proc.-Sci. Meas. Technol. 151, 394 (2004)).

Figure 1:
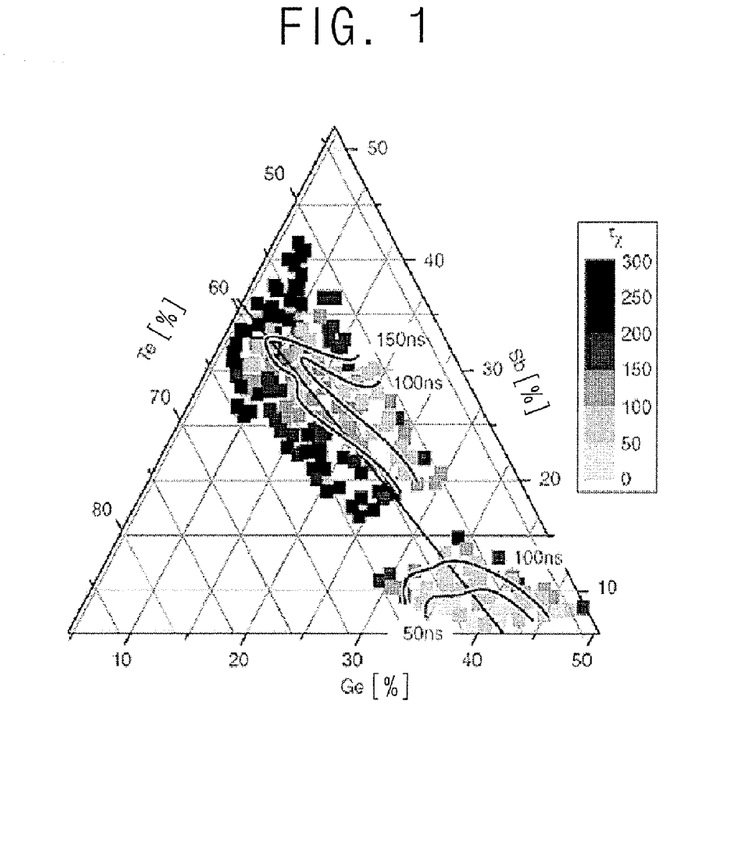
FIG. 1 is a ternary composition diagram of a phase-change material layer including germanium-antimony-tellurium (Ge—Sb—Te) (GST) formed by a composition-spread method.

FIG. 1 presents a ternary composition diagram of a phase-change material layer including GST formed by a composition-spread method. More specifically, germanium-antimony-tellurium ($Ge_2Sb_2Te_5$) as used in a phase-change material layer may include about 22% by weight germanium (Ge), about 22% by weight antimony (Sb) and about 56% by weight tellurium (Te). When impurities, such as nitrogen (N), carbon (C), oxygen (O), silicon (Si), etc., are doped into the phase-change material layer, the phase-change material layer may have a changed composition ratio at least due to the amount of the impurities.

In a conventional sputtering method of forming a phase-change material layer, the composition ratio of the phase-change material layer may be changed by controlling the amount of germanium, antimony and tellurium. However, tellurium may have only a content in a range of about 50 to about 65% by weight in the phase-change material layer, at least because germanium telluride (GeTe) and antimony telluride ($Sb_2Te_3$) in the phase-change material layer commonly include tellurium. Reducing the content of tellurium to under about 50% by weight may be problematic.

Even when using a method allowing improved control of the composition ratio of a phase-change material layer as discussed in Korean Laid-Open Patent Publication No. 2006-599395, forming a phase-change material layer having a composition ratio in which tellurium has an amount outside the above-referenced range may present difficulties.

SUMMARY OF THE INVENTION

Embodiments of the present invention provide methods of forming a phase-change material layer including having a substrate and a chalcogenide target comprising germanium (Ge), antimony (Sb) and tellurium (Te) maintained at a temperature wherein tellurium is volatilized and antimony is not volatilized, and performing a sputtering process to form the phase-change material layer including a chalcogenide material on the substrate. In some embodiments, the sputtering process may be performed at a temperature that is higher than the vitrification temperature of tellurium and lower than the vitrification temperature of antimony. In some embodiments, performing the sputtering process includes depositing particles of the chalcogenide target on the substrate to form a preliminary chalcogenide material, and volatilizing at least some portions of tellurium included in the preliminary chalcogenide material to form a subsequent chalcogenide material including about 5 to about 50% by weight tellurium. In further embodiments, methods of forming a phase-change material layer including germanium-antimony-tellurium (Ge—Sb—Te) (GST) include those in which tellurium (Te) has a content of less than about 50% by weight.

Embodiments of the present invention further include methods of manufacturing a phase-change memory device including forming a lower electrode on a substrate in a chamber having a chalcogenide target therein, wherein the chalcogenide target includes germanium, antimony and tellurium; providing a temperature wherein tellurium is volatilized and antimony is not volatilized; performing a sputtering process to form a phase-change material layer including a chalcogenide material on the substrate; and forming an upper electrode on the phase-change material layer. In some embodiments, the sputtering process may be performed at a temperature that is higher than the vitrification temperature of tellurium and lower than the vitrification temperature of antimony. In some embodiments, the substrate is a semiconductor substrate. The semiconductor substrate may include a gate insulation later, gate conductive layer and gate mask layer formed sequentially thereon. Insulating and conductive layers may be further formed thereon. In some embodiments, manufacturing a phase-change memory device includes having a phase-change material layer including GST in which tellurium has a content of less than about 50% by weight.

BRIEF DESCRIPTION OF THE DRAWINGS

The above and other features and advantages of the invention will become readily apparent by reference to the following detailed description when considered in conjunction with the accompanying drawings wherein.

DETAILED DESCRIPTION

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. All publications, patent applications, patents, and other references mentioned herein are incorporated by reference in their entirety.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Moreover, it will be understood that steps comprising the methods provided herein can be performed independently or at least two steps can be combined. Additionally, steps comprising the methods provided herein, when performed independently or combined, can be performed at the same temperature and/or atmospheric pressure or at different temperatures and/or atmospheric pressures without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art.

Phase-Change Material Layer

Figure 2:
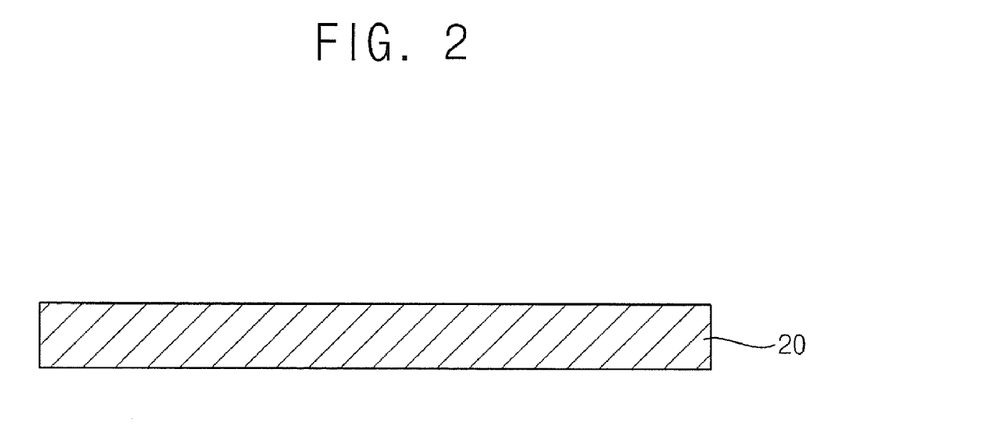
FIG. 2 is a cross-sectional view illustrating a phase-change material layer in accordance with some embodiments of the present invention.

FIG. 2 is a cross-sectional view illustrating a phase-change material layer in accordance with some embodiments of the present invention.

Referring to FIG. 2, a phase-change material layer 20 may include a chalcogenide material or a chalcogenide material doped with impurities. The chalcogenide material may include germanium-antimony-tellurium (Ge—Sb—Te), arsenic-antimony-tellurium (As—Sb—Te), arsenic-germanium-antimony-tellurium (As—Ge—Sb—Te), tin-antimony-tellurium (Sn—Sb—Te), indium-antimony-tellurium (In—Sb—Te), silver-indium-antimony-tellurium (Ag—In—Sb—Te), an element in Group 15-antimony-tellurium (Group 15 element-Sb—Te), an element in Group 16-antimony-tellurium (Group 16 element-Sb—Te), etc. The chalcogenide material including germanium-antimony-tellurium (Ge—Sb—Te) (GST) may be used for the phase-change material 20 in particular embodiments.

A chalcogenide material may have phase transition characteristics when exposed to heat. The heat provided to the chalcogenide material may be controlled by an electrical current. Therefore, the chalcogenide material may have a crystal structure that is changed according to the amount of electrical current applied thereto and the amount of time for which the current is provided thereto. The chalcogenide material may have a resistance difference between an amorphous state and a crystalline state (particularly, the chalcogenide material in the crystalline state may have a resistance lower than that of the chalcogenide material in the amorphous state), and thus, may be included in a memory device at least, in part, because the resistance of the chalcogenide material may be used as a criterion for a logic state.

In some embodiments of the present invention, the phase-change material layer 20 may include a chalcogenide material that may include germanium (Ge), antimony (Sb) and tellurium (Te). The chalcogenide material may have about 5 to about 50% by weight tellurium. In some embodiments, the phase-change material layer 20 has a chalcogenide material including about 20 to about 50% by weight tellurium including impurities. In other embodiments, the phase-change material layer 20 has a chalcogenide material including about 30 to about 50% by weight tellurium including impurities. Impurities that may be included in the phase-change material layer 20 may include, for example, oxygen (O), silicon (Si), carbon (C) or nitrogen (N). These elements may be employed alone or in a combination thereof.

The phase-change material layer 20 may include a chalcogenide material represented by formula (1). The phase-change material layer 20 may include about 86 to about 98% by weight chalcogenide material and about 2 to about 10% by weight impurities.

$$Ge_xSb_yTe_{(100-x-y)} \qquad \text{Formula (1)}$$

where $25 \leqq x \leqq 35$ and $25 \leqq y \leqq 35$

In some embodiments of the present invention, the chalcogenide material may include about 25 to about 40% by weight germanium, about 25 to about 40% by weight antimony, and about 20 to about 50% by weight tellurium. In some other embodiments of the present invention, the chalcogenide material may include about 25 to about 35% by weight germanium, about 25 to about 35% by weight antimony, and about 30 to about 50% by weight tellurium. Accordingly, the chalcogenide material may have a composition ratio in which the content of germanium:antimony:tellurium (Ge:Sb:Te) is about 1:1:1 to about 1:1:2.

The phase-change material layer 20 may have about 86 to about 98% by weight chalcogenide material, which may include about 25 to about 35% by weight germanium, about 25 to about 35% by weight antimony, about 30 to about 50% by weight tellurium, and about 2 to about 14% by weight impurities. The content of tellurium in the chalcogenide material may be changed according to conditions under which the phase-change material layer 20 is formed, for example, temperature, deposition speed and like variables as understood by one of ordinary skill in the art.

The phase-change material layer 20 may include a chalcogenide layer doped with impurities, a GST layer doped with impurities, etc. For example, when the impurities include nitrogen, the phase-change material layer 20 may have about 90 to about 98% by weight chalcogenide material that may include about 25 to about 35% by weight germanium, about 25 to about 35% by weight antimony, about 30 to about 50% by weight tellurium, and about 2 to about 10% by weight nitrogen. By way of further example, when the impurities include carbon, the phase-change material layer 20 may have about 85 to about 98% by weight chalcogenide material that may include about 25 to about 35% by weight germanium, about 25 to about 35% by weight antimony, about 30 to about 50% by weight tellurium, and about 2 to about 15% by weight carbon.

As described above, the chalcogenide material layer 20 may have a composition ratio in which tellurium has an amount of about 5 to about 50% by weight based on the total weight of the chalcogenide material layer 20, so that a phase-change memory device including the phase-change material layer 20 may have improved electrical characteristics and desirable crystallization characteristics.

Methods of Forming a Phase-Change Material Layer

Figure 3:
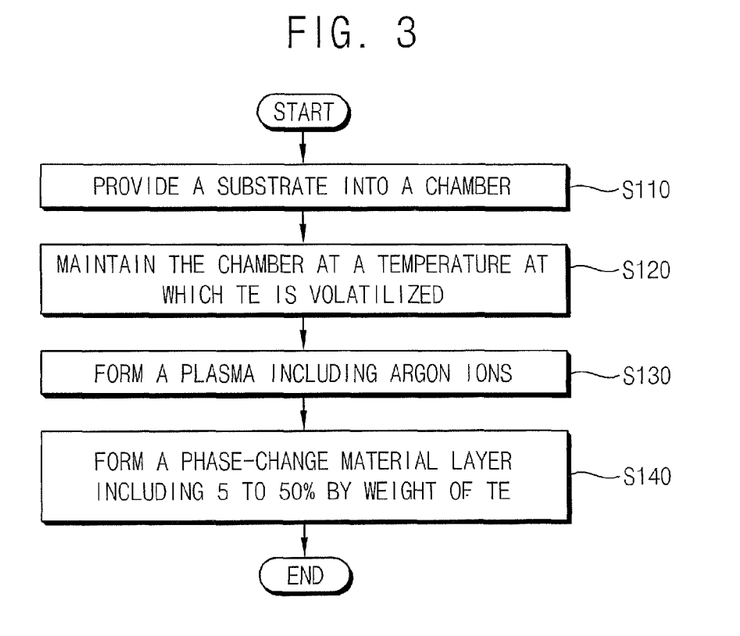
FIG. 3 is a flowchart illustrating a method of forming a phase-change material layer in accordance with some embodiments of the present invention.

FIG. 3 is a flowchart illustrating a method of forming a phase-change material layer in accordance with some embodiments of the present invention. More specifically, in step S110 of FIG. 3, a substrate on which the phase-change material layer may be formed may be provided into a chamber in which a sputtering process may be performed.

The chamber may have a stage, a chalcogenide target and a power supply for providing a direct current (DC) voltage therein. The stage may support the substrate provided in the chamber.

In an embodiment of the present invention, the chalcogenide target may include a chalcogenide material having a chemical formula of $Ge_2Sb_2Te_5$. The chalcogenide material may have about 22% by weight germanium, about 22% by weight antimony and about 56% by weight tellurium. In a further embodiment of the present invention, the chalcogenide target may have a first target that may include germanium telluride (GeTe) and a second target that may include antimony telluride ($Sb_2Te_3$).

Additionally, the chalcogenide target may include impurities such as oxygen, silicon, carbon, nitrogen, etc. When the phase-change material layer is formed by a sputtering process, the time for stabilizing the chalcogenide target may be controlled by the impurities.

The power supply can supply a negative high voltage to the chalcogenide target, so that a high voltage difference between the stage and the chalcogenide target may be generated.

In step S120, the chamber may be maintained at a temperature at which tellurium that may be included in the chalcogenide target may be volatilized. Particularly, the chamber may be maintained to provide a temperature at which tellurium may be volatilized and at which antimony may not be volatilized.

Generally, germanium, antimony and tellurium that may be included in the chalcogenide target may have melting points of about 938° C., about 631° C. and about 450° C., respectively. The melting point may be lower where the particle size is decreased. Additionally, the chalcogenide target has a vitrification temperature, and thus, germanium, antimony and tellurium may be volatilized at a temperature higher than the vitrification temperature. Tellurium (Te) has a relatively low vitrification temperature of about 250° C. to about 350° C. compared to other elements in the chalcogenide target.

In some embodiments of the present invention, the sputtering process may be performed at a temperature of about 250° C. to about 300° C., which is higher than the vitrification temperature of tellurium and lower than the vitrification temperature of antimony. The chamber may be maintained to have a temperature in the range of about 250° C. to about 350° C. by a heater in the stage.

In step S130, plasma including argon (Ar) ions may be generated in the chamber, so that a sputtering process may be performed. Particularly, a negative voltage may be applied to the chalcogenide target by the power supply. The power supply may apply the voltage at a power level of about 300 W to about 700 W, and in some embodiments, about 500 W. Therefore, a high voltage difference may be generated between the chalcogenide target and the stage.

Argon gas may be introduced into the chamber in which the high voltage has been generated. The argon gas may be excited to a plasma state including argon ions in the chamber. The introduction of the argon gas and the application of the negative voltage may be performed simultaneously.

In an embodiment of the present invention, the argon gas may be provided into the chamber at a flow rate of about 30 to about 80 sccm, and in some embodiments, at a flow rate of about 40 to about 60 sccm. Additionally, nitrogen ($N_2$) gas may be provided into the chamber. The nitrogen gas may be provided at a flow rate of about 10 to about 100 sccm, and in some embodiments, at a flow rate of about 25 to about 80 sccm.

In some embodiments of the present invention, when the nitrogen gas is provided with the argon gas, the argon gas and nitrogen gas may have a flow rate ratio of about 1:0.3 to about 1:2.0, and in some embodiments, about 1:0.35 to about 1:1.5.

The nitrogen gas may improve the reliability of the phase-change material layer and/or decrease the deposition rate of particles from the chalcogenide target into the substrate so that the time for forming the phase-change material layer may be increased. Accordingly, the nitrogen gas may assist tellurium in being volatilized, and thus, the tellurium may have a content below about 50% by weight in the chalcogenide material of the phase-change material layer.

In step S140, the phase-change material layer having a chalcogenide material that includes about 5 to about 50% by weight tellurium in the phase-change material layer may be formed in the chamber in which the plasma includes the argon ions.

Particularly, the argon ions that may be included in the plasma impact the chalcogenide target at a high speed, and thus, particles in the chalcogenide target may separate from the chalcogenide target and be physically deposited onto the substrate.

The particles separated from the chalcogenide target may be deposited onto the substrate, thereby forming a preliminary chalcogenide material layer. The preliminary chalcogenide material layer on the substrate may be in an unstable state, so that at least some portions of tellurium may be volatilized at a temperature of about 250 to about 300° C. Thus, a chalcogenide material layer having a chalcogenide material, which may include about 5 to about 50% by weight tellurium, and in some embodiments, about 30 to about 50% by weight tellurium, may be formed on the substrate.

In some embodiments of the present invention, the phase-change material layer formed under the above conditions may have a chalcogenide material that may include about 25 to about 35% by weight germanium, about 25 to about 35% by weight antimony and about 30 to about 50% by weight tellurium. In some embodiments, the phase-change material layer may have about 86 to about 98% of the chalcogenide material layer, which may include about 25 to about 35% by weight germanium, about 25 to about 35% by weight antimony, about 30 to about 50% by weight tellurium, and about 2 to about 14% impurities. In some embodiments, the phase-change material layer may include about 90 to about 98% of the chalcogenide material layer, which may include about 25 to about 35% by weight germanium, about 25 to about 35% by weight antimony, about 30 to about 50% by weight tellurium, and about 2 to about 10% impurities.

In another embodiment of the present invention, the phase-change material layer may include about 92 to about 98% of the chalcogenide material layer, which may include about 24 to about 31% by weight germanium, about 24 to about 31% by weight antimony, about 30 to about 50% by weight tellurium, and about 2 to about 8% by weight nitrogen.

Figure 4:
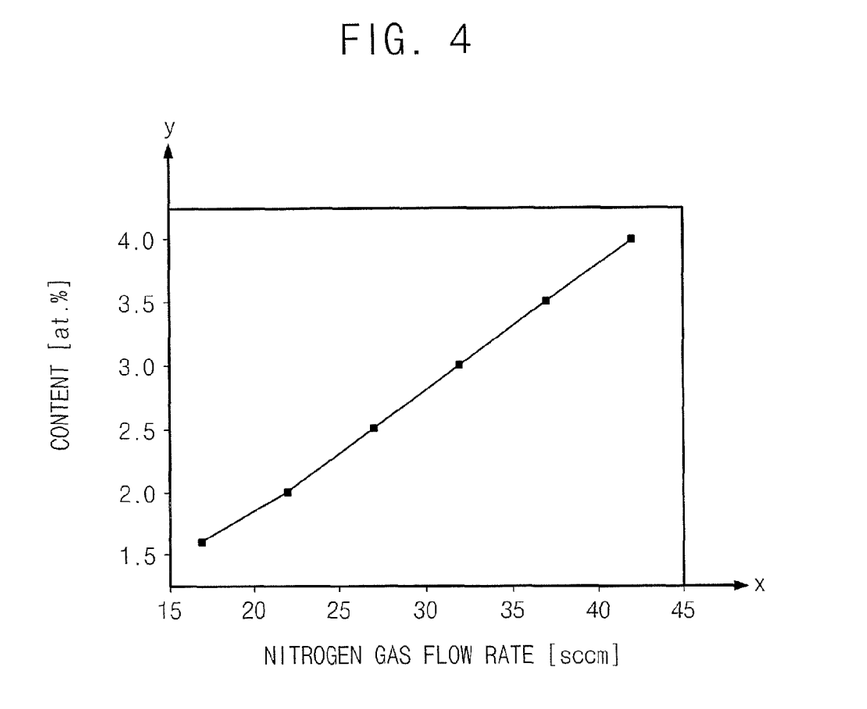
FIG. 4 is a graph illustrating a change of nitrogen content in a phase-change material layer according to a flow rate of nitrogen gas in accordance with some embodiments of the present invention.

FIG. 4 is a graph illustrating the change in nitrogen content in a phase-change material layer according to the flow rate of nitrogen gas in accordance with some embodiments of the present invention. In FIG. 4, the x-axis represents the flow rate of nitrogen gas, and the y-axis represents the nitrogen content in the phase-change material layer. Referring to FIG. 4, when the phase-change material layer is formed by a sputtering process using a $Ge_2Sb_2Te_5$ target with an increased flow rate of the nitrogen gas, the nitrogen content in the phase-change material layer was increased. That is, the nitrogen content in the phase-change material layer was proportional to the flow rate of the nitrogen gas.

Figure 5:
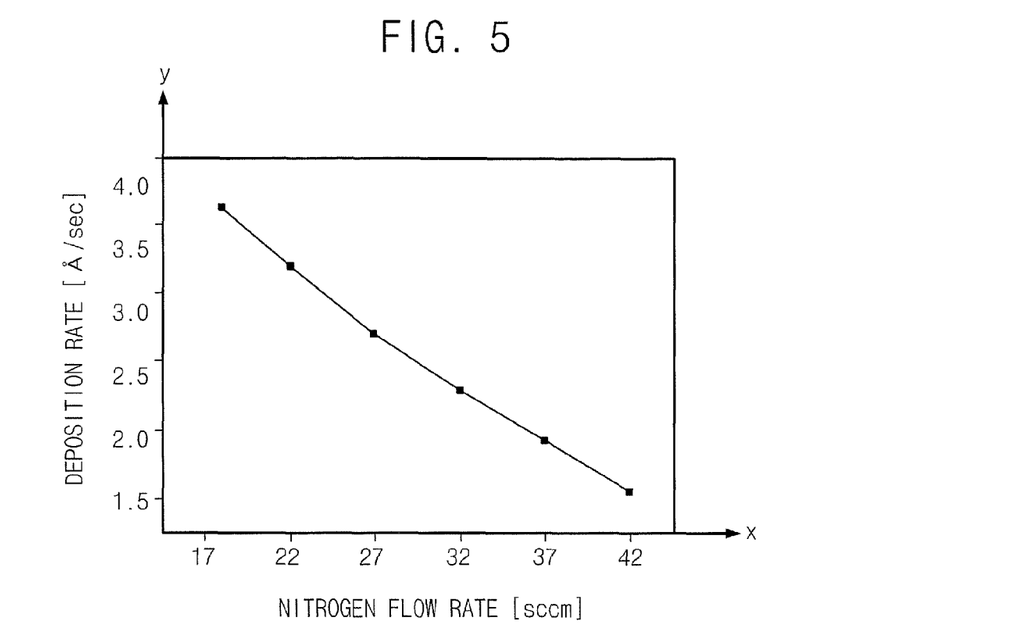
FIG. 5 is a graph illustrating a change of deposition rate of a phase-change material layer according to a flow rate of nitrogen gas in accordance with some embodiments of the present invention.

FIG. 5 is a graph illustrating a change of the deposition rate of a phase-change material layer according to the flow rate of nitrogen gas in accordance with some embodiments of the present invention. In FIG. 5, the x-axis indicates the flow rate of the nitrogen gas, and the y-axis indicates the deposition rate of the phase-change material layer on the substrate.

Referring to FIG. 5, when the phase-change material layer was formed by a sputtering process using a $Ge_2Sb_2Te_5$ target with an increased flow rate of nitrogen gas, the deposition rate of the phase-change material layer was decreased. That is, the deposition rate of the phase-change material layer was inversely proportional to the flow rate of the nitrogen gas.

Figure 6:
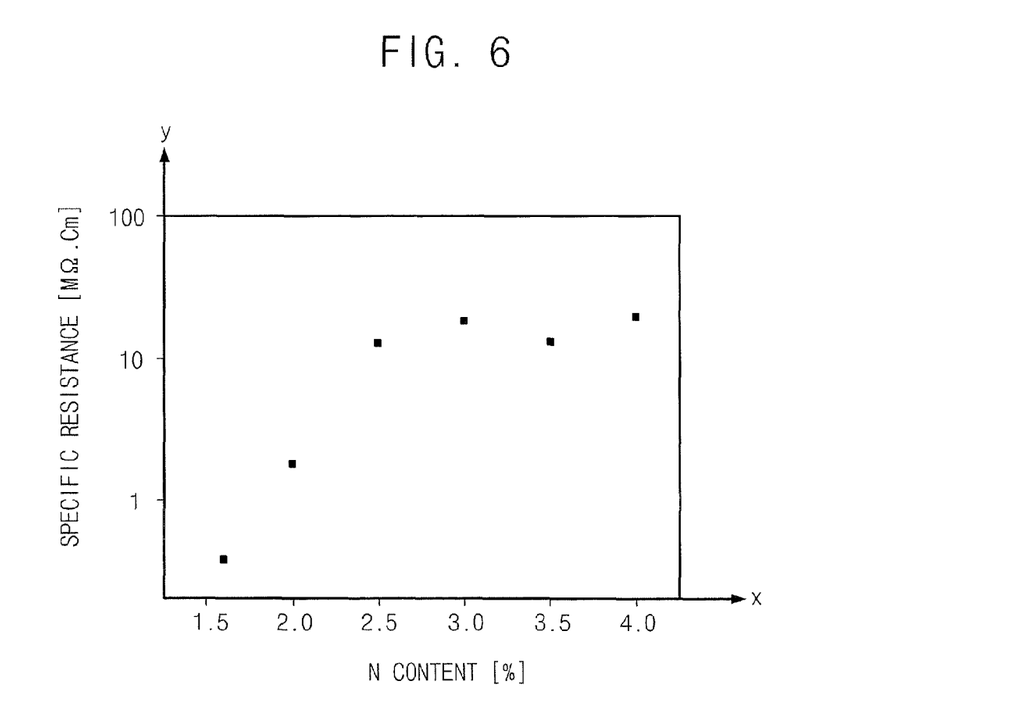
FIG. 6 is a graph illustrating a change of a specific resistance of a phase-change material layer according to the nitrogen content in accordance with some embodiments of the present invention.

FIG. 6 is a graph illustrating a change of a specific resistance of a phase-change material layer according to the nitrogen content in accordance with some embodiments of the present invention. In FIG. 6, the x-axis represents the nitrogen content and the y-axis represents the specific resistance of the phase-change material layer. Referring to FIG. 6, when the phase-change material layer was formed by a sputtering process using a $Ge_2Sb_2Te_5$ target with the nitrogen content increased, the specific resistance of the phase-change material layer was also increased. More specifically, the specific resistance in the phase-change material layer was proportional to the nitrogen content.

Methods of a Manufacturing a Phase-Change Memory Device

FIGS. 7 to 14 are cross-sectional views illustrating a method of manufacturing a phase-change memory device in accordance with some embodiments of the present invention.

Figure 7:
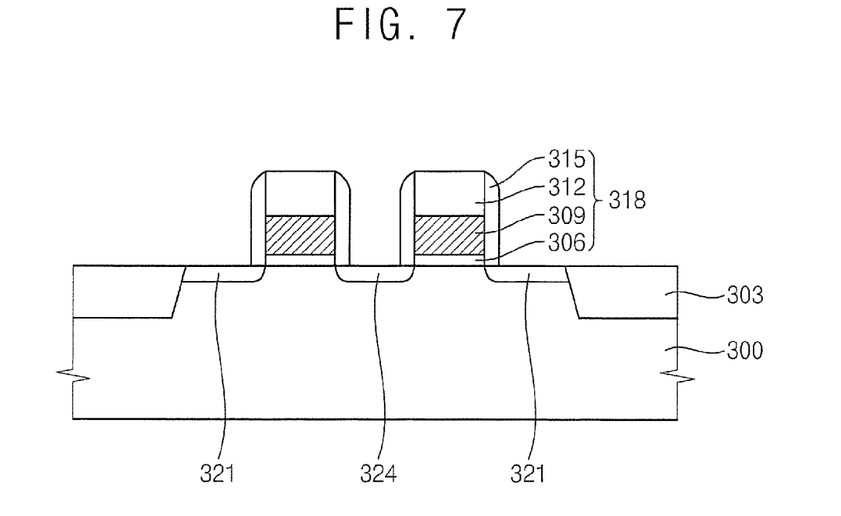
FIGS. 7 to 14 are cross-sectional views illustrating a method of manufacturing a phase-change memory device in accordance with some embodiments of the present invention.

Referring to FIG. 7, an isolation layer 303 may be formed on a semiconductor substrate 300. The semiconductor substrate 300 may be divided into an active region and a field region by the isolation layer 303. The isolation layer 303 may be formed by a shallow trench isolation (STI) process or by a local oxidation of silicon (LOCOS) process. The isolation layer 303 may be formed using silicon oxide ($SiO_2$).

A gate insulation layer, gate conductive layer and gate mask layer may be formed sequentially on the semiconductor substrate 300. The gate insulation layer may be formed using an oxide or a metal oxide having a high dielectric constant such as aluminum oxide ($Al_2O_3$), hafnium oxide ($HfO_2$), etc. For example, the gate insulation layer may be formed using silicon oxide, hafnium oxide, zirconium oxide ($ZrO_2$), titanium oxide ($Ti_2O_3$), tantalum oxide ($Ta_2O_5$), aluminum oxide, etc. The gate insulation layer may be formed by a thermal oxidation process, a chemical vapor deposition (CVD) process, a sputtering process, a plasma-enhanced chemical vapor deposition (PECVD) process, an atomic layer deposition (ALD) process, a high-density plasma chemical vapor deposition (HDP-CVD) process, etc. The gate conductive layer may be formed using doped polysilicon, a metal or a metal silicide. For example, the gate conductive layer may be formed using tungsten (W), aluminum (Al), titanium (Ti), tantalum (Ta), tungsten silicide ($WSi_2$), titanium silicide ($TiSi_2$), cobalt silicide ($CoSi_2$), etc. The gate conductive layer may be formed by a CVD process, a sputtering process, a PECVD process, an ALD process, etc. The gate mask layer may be formed using a material having an etching selectivity with respect to the gate conductive layer and the gate insulation layer. The gate mask layer may be formed using silicon nitride ($Si_3N_4$), silicon oxynitride (SiON) or metal oxynitride. The gate mask layer may be formed by a CVD process, a sputtering process, a PECVD process, an ALD process, etc.

The gate mask layer, the gate conductive layer and the gate insulation layer may be at least partially removed to form a gate mask 312, a gate electrode 309 and a gate insulation layer pattern 306, respectively.

A first insulation layer may be formed on the semiconductor substrate 300 to cover the gate mask 312, the gate electrode 309 and the gate insulation layer pattern 306. The first insulation layer may be formed using silicon nitride. The first insulation layer may be at least partially removed to form a gate spacer 315 on a sidewall of the gate mask 312, the gate electrode 309 and the gate insulation layer pattern 306. The gate spacer 315 may be formed by an anisotropic etching process. Therefore, a gate structure 318 including the gate insulation layer pattern 306, the gate electrode 309, the gate mask 312 and the gate spacer 315 may be formed on the semiconductor substrate 300.

Impurities may be implanted into the semiconductor substrate 300 using the gate structure 318 as an implantation mask to form a first impurity region 321 and a second impurity region 324 at upper portions of the semiconductor substrate 300. As a result, a transistor including the gate structure 318 and the first and second impurity regions 321 and 324 may be formed on the semiconductor substrate 300. The first and the second impurity regions 321 and 324 may serve as a source/drain region.

Figure 8:
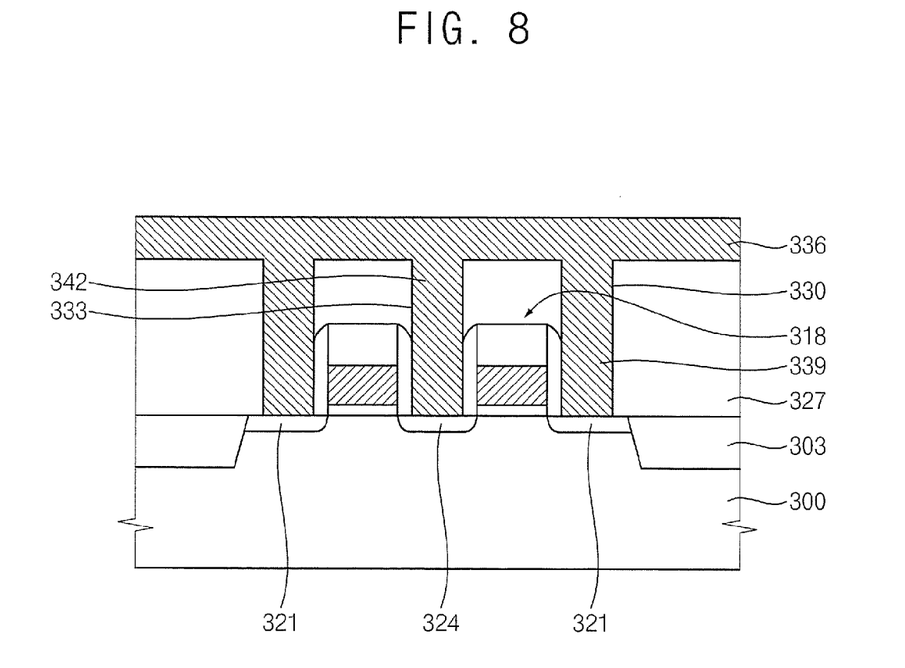

Referring to FIG. 8, a first insulating interlayer 327 may be formed on the semiconductor substrate 300 to cover the transistor. The first insulating interlayer 327 may be formed using borophosphosilicate glass (BPSG), phosphosilicate glass (PSG), tetraethyl orthosilicate (TEOS), plasma-enhanced tetraethyl orthosilicate (PE-TEOS), undoped silicate glass (USG), flowable oxide (FOx), spin-on glass (SOG), HDP-CVD oxide, etc. The first insulating interlayer 327 may be formed by a CVD process, a PECVD process, an ALD process, an HDP-CVD process, etc.

The first insulating interlayer 327 may be at least partially removed to form a first contact hole 330 and a second contact hole 333 therethrough. The first contact hole 330 exposes the first impurity region 321, and the second contact hole 333 exposes the second impurity region 324.

A first conductive layer 336 may be formed on the first and second impurity regions 321 and 324 and the first insulating interlayer 327 to fill the first and second contact holes 330 and 333. The first conductive layer 336 may be formed using doped polysilicon, a metal or a conductive metal nitride. The first conductive layer 336 may be formed by a sputtering process, a CVD process, a PECVD process, an ALD process, an electron beam deposition (EBD) process, or a pulsed laser deposition (PLD) process. For example, the first conductive layer 336 may be formed using tungsten, titanium, titanium nitride (TiN), aluminum, titanium aluminum nitride (TiAlN), tungsten nitride (WN), aluminum nitride (AlN), etc.

Figure 9:
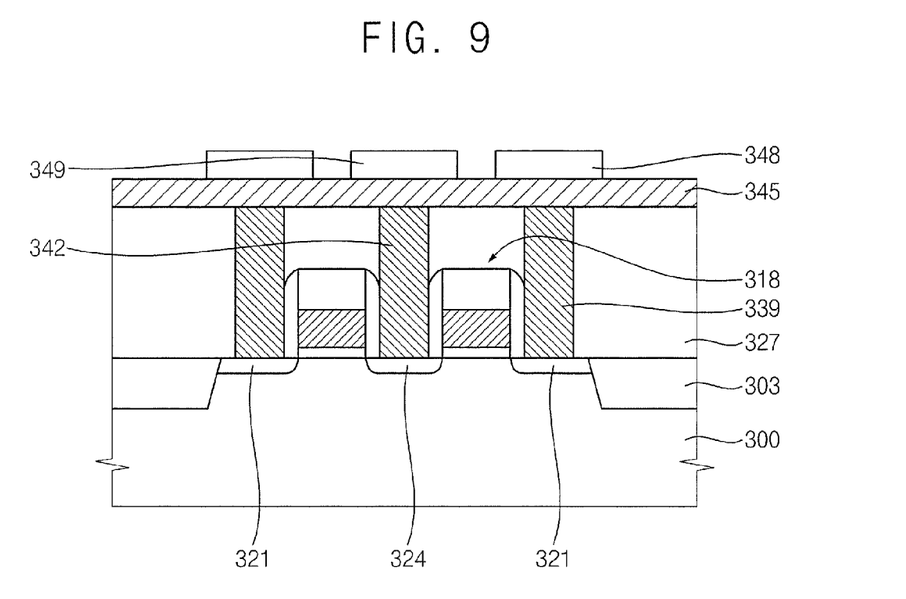

Referring to FIG. 9, the first conductive layer 336 may be at least partially removed by a chemical mechanical polishing (CMP) process, an etch-back process, or a combination process of CMP and etch-back until the first insulating interlayer 327 is exposed. Therefore, a first contact 339 and a second contact 342 may be formed in the first and second contact holes 330 and 333, respectively. The first contact 339 may be formed on the first impurity region 321, and the second contact 342 may be formed on the second impurity region 324.

A second conductive layer 345 may be formed on the first and second contacts 339 and 342 and the first insulating interlayer 327. The second conductive layer 345 may be formed by a sputtering process, a CVD process, a PECVD process, an ALD process, an EBD process, a PLD process, etc. For example, the second conductive layer 345 may be formed using tungsten, titanium, titanium nitride, aluminum, titanium aluminum nitride, tungsten nitride, aluminum nitride, etc.

After forming a second insulation layer on the second conductive layer 345, the second insulation layer may be partially removed to form a first insulation layer pattern 348 and a second insulation layer pattern 349 on the second conductive layer 345. The second insulation layer may be formed using a nitride or an oxynitride by a CVD process, a PECVD process, an ALD process, an HDP-CVD process, etc. The first insulation layer pattern 348 may be formed on a portion of the second conductive layer 345 beneath which the first contact 339 may be formed, and the second insulation layer pattern 349 may be formed on a portion of the second conductive layer 345 beneath which the second contact 342 may be formed.

Figure 10:
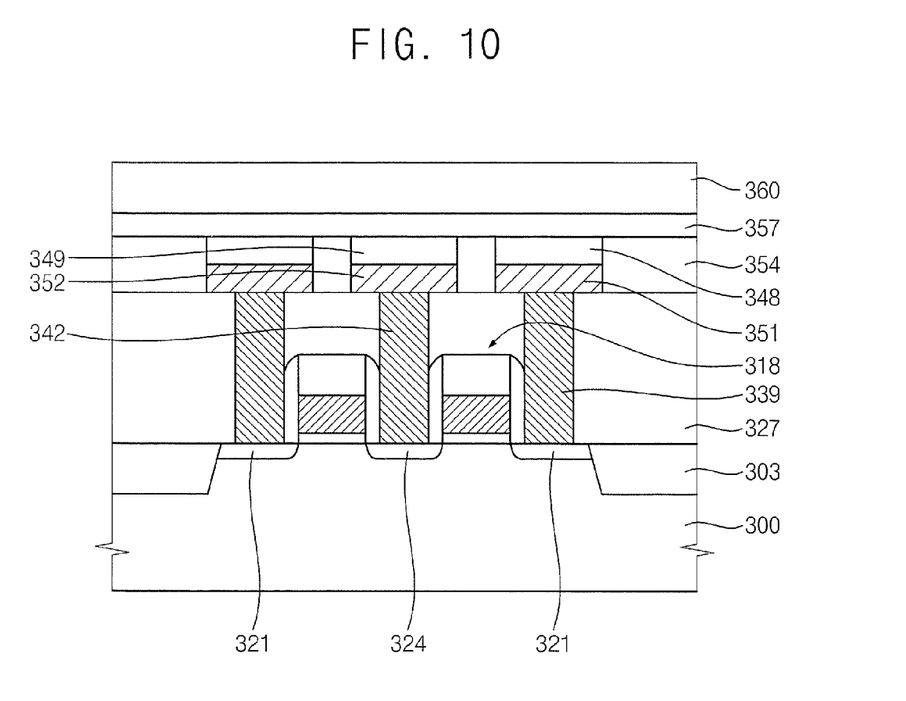

Referring to FIG. 10, the second conductive layer 345 may be at least partially removed by an etching process using the first and second insulation patterns 348 and 349 as an etching mask to form a pad 351 and a lower metal wiring 352. The pad 351 may be formed on the first contact 339 and the first insulating interlayer 327, and the lower metal wiring 352 may be formed on the second contact 342 and the first insulating interlayer 327. Therefore, the pad 351 may be electrically connected to the first impurity region 321 by way of the first contact 339, and the lower metal wiring 352 may be electrically connected to the second impurity region 324 by way of the second contact 342.

A second insulating interlayer 354 may be formed on the first insulating interlayer 327 to cover the first and second insulation layer patterns 348 and 349. The second insulating interlayer 354 may be formed using BPSG, PSG, TEOS, PE-TEOS, USG, FOx, SOG, HDP-CVD oxide, etc. The second insulating interlayer 354 may be formed by a CVD process, a PECVD process, an ALD process, an HDP-CVD process, etc.

The second insulating interlayer 354 may be at least partially removed by a CMP process, an etch-back process, or a combination process of CMP and etch-back until the first and second insulation layer patterns 348 and 349 are exposed. For example, the second insulating interlayer 354 may be partially removed using a slurry including an abrasive such as silica that has a high etching selectivity between that of an oxide and a nitride.

A third insulation layer 357 may be formed on the second insulating interlayer 354 and the first and second insulation layer patterns 348 and 349. The third insulation layer 357 may be formed using BPSG, PSG, TEOS, PE-TEOS, USG, FOx, SOG, HDP-CVD oxide, etc. The third insulation layer 354 may be formed by a CVD process, a PECVD process, an ALD process, an HDP-CVD process, etc.

A sacrificial layer 360 may be formed on the third insulation layer 357. The sacrificial layer 360 may be formed by a CVD process, a PECVD process, an ALD process, an HDP-CVD process, etc.

Figure 11:
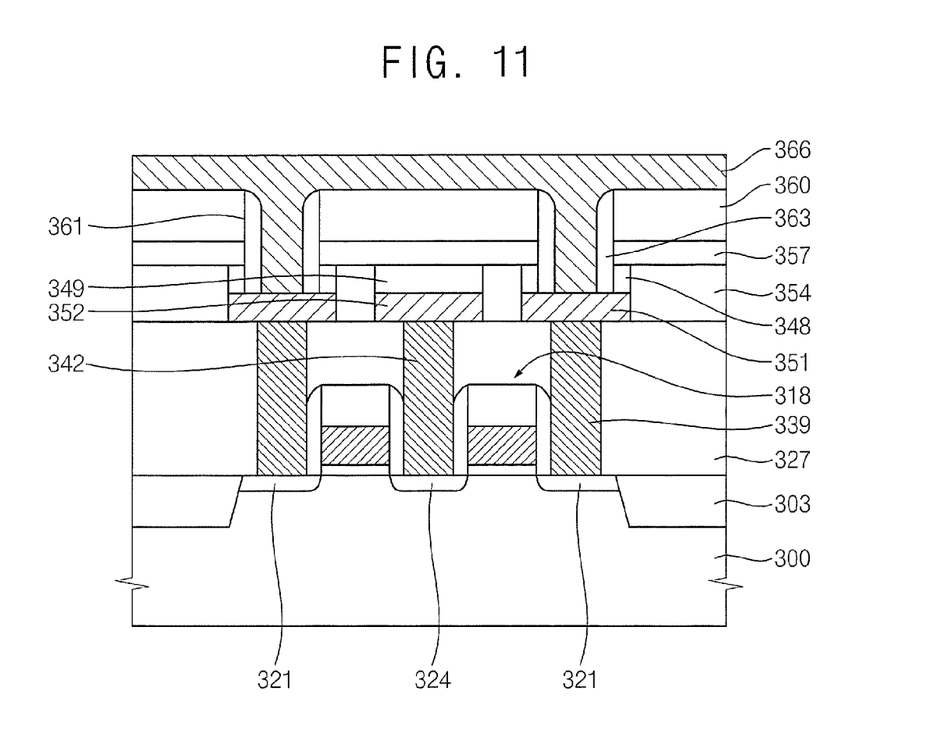

Referring to FIG. 11, the sacrificial layer 360, the third insulation layer 357 and first insulation layer pattern 348 may be at least partially removed to form a lower hole 361 therethrough.

A fourth insulation layer may be formed on the pad 351 and the sacrificial layer 360 to fill the lower hole 361. The fourth insulation layer may be at least partially removed by an anisotropic etching process to form a preliminary spacer 363 and a sidewall of the lower hole 361. For example, the fourth insulation layer may be formed using silicon nitride.

A third conductive layer 366 may be formed on the pad 351, the preliminary spacer 361 and the sacrificial layer 360 to fill the lower hole 361. The third conductive layer 366 may be formed using a metal, a metal nitride, a metal silicon nitride, doped polysilicon, etc. For example, the third conductive layer 366 may be formed using tungsten, tungsten nitride, titanium, titanium nitride, tantalum, tantalum nitride (TaN), molybdenum nitride ($Mo_2N$), niobium nitride (NbN), titanium silicon nitride (TiSiN), aluminum, aluminum nitride, titanium aluminum nitride, titanium boron nitride (TiBN), zirconium silicon nitride (ZrSiN), molybdenum silicon nitride (MoSiN), molybdenum aluminum nitride (MoAlN), tantalum silicon nitride (TaSiN), etc. The third conductive layer 366 may be formed by a sputtering process, a CVD process, a PECVD process, an ALD process, an EBD process, a PLD process, etc.

Figure 12:
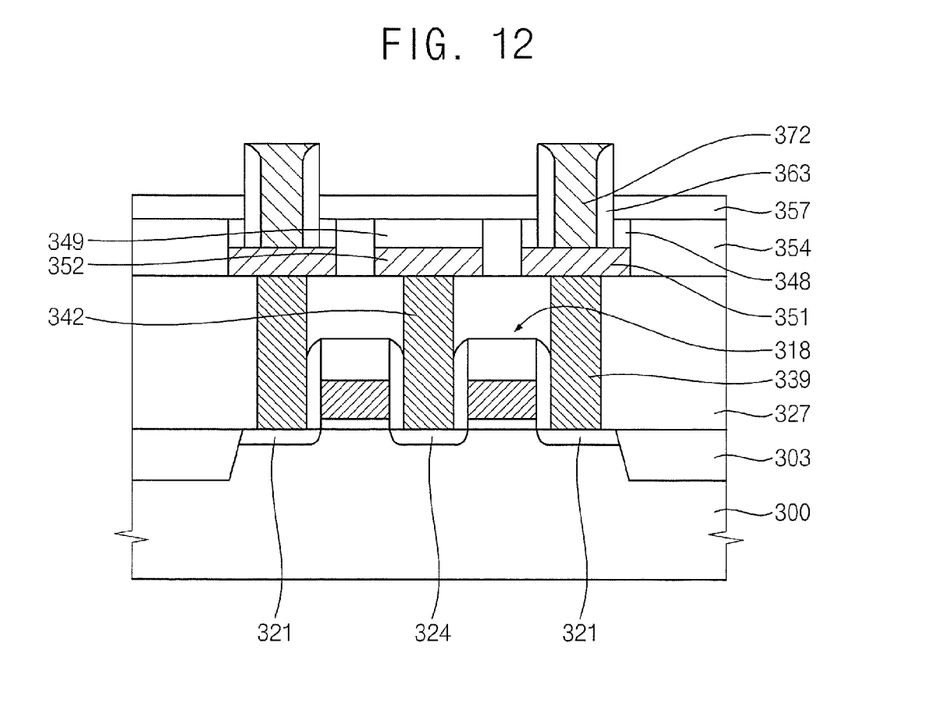

Referring to FIG. 12, the third conductive layer 366 may be at least partly removed by a CMP process and/or an etch-back process until the sacrificial layer 360 may be exposed to form a preliminary bottom electrode 372.

The sacrificial layer 360 may be removed until the second insulation layer 357 may be exposed by an etch-back process. Therefore, the preliminary bottom electrode 372 and the preliminary spacer 369 may protrude above the second insulation layer 357.

Figure 13:
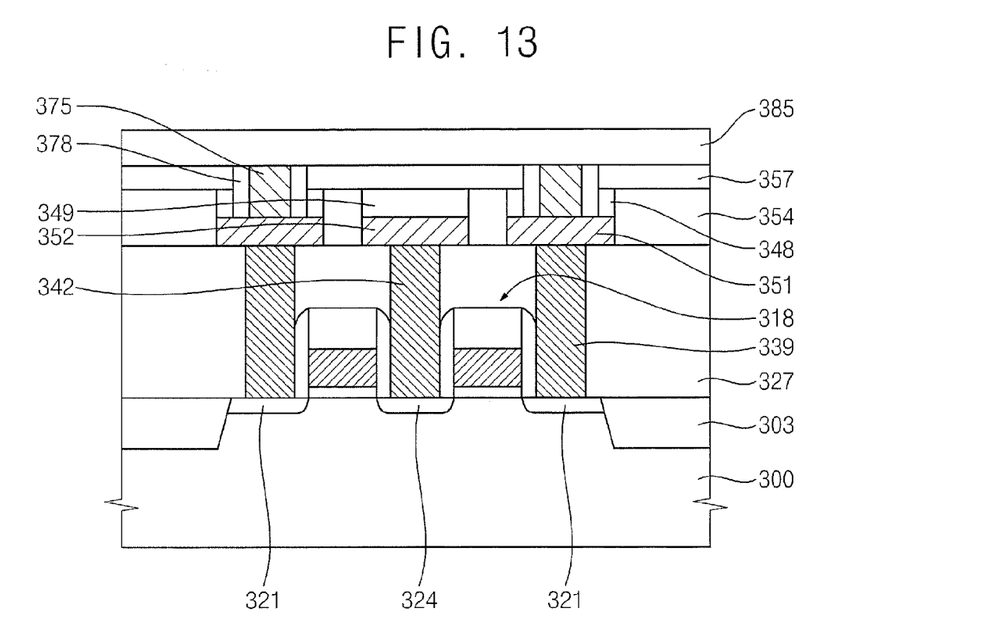

Referring to FIG. 13, portions of the protruding preliminary bottom electrode 372 and preliminary spacer 369 may be removed by a CMP process to form a bottom electrode 375 and a spacer 378 on the pad 351. For example, the preliminary bottom electrode 372 and the preliminary spacer 369 may be removed using a slurry including an abrasive such as silica that has a high etching selectivity between that of an oxide and a nitride. When the bottom electrode 375 and the spacer 378 are formed, the second insulation layer 357 may be at least partially removed.

A phase-change material layer 385 including GST may be formed on the bottom electrode 375, the spacer 378 and the second insulation layer 357.

The phase-change material layer 385 may be formed by a sputtering process using a chalcogenide target including antimony and tellurium. In the sputtering process, the phase-change material layer 385 may be formed by depositing particles from the chalcogenide target on a substrate at a temperature at which tellurium may be volatilized and antimony may not be volatilized. The phase-change material layer 385 may have a chalcogenide material that may include about 5 to about 50% by weight tellurium. The sputtering process may be performed at a temperature of about 250 to about 350° C. under an atmosphere of nitrogen gas and argon gas.

The phase-change material layer 385 may be formed by the method illustrated with reference to FIG. 3, and therefore, the specific method is omitted here.

Figure 14:
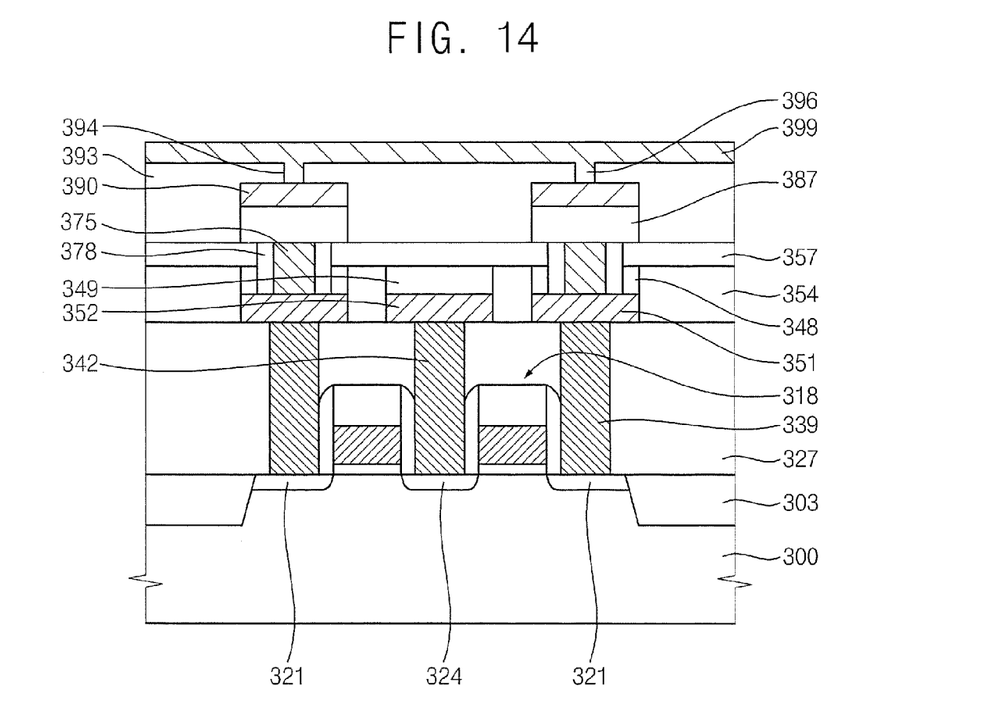

Referring to FIG. 14, a fourth conductive layer 385 may be formed on the phase-change material layer 385. The fourth conductive layer 385 may be formed by a sputtering process, a CVD process, a PECVD process, an ALD process, an EBD process, a PLD process, etc. The fourth conductive layer 385 may be formed using a metal, a metal nitride, doped polysilicon, etc. For example, the fourth conductive layer 385 may be formed using tungsten, titanium, titanium nitride, aluminum, titanium aluminum nitride, tungsten nitride, aluminum nitride, doped polysilicon, etc.

The fourth conductive layer 385 and the phase-change material layer 385 may be partially etched by a photolithography process to form an upper electrode 390 and a phase-change material layer pattern 387, respectively. The phase-change material pattern 387 may be formed on the bottom electrode 378, the spacer 375 and the second insulation layer 357. The upper electrode 390 may be formed on the phase-change material pattern 387.

A third insulating interlayer 393 may be formed on the second insulating interlayer 357 to cover the upper electrode 390 and the phase-change material layer pattern 387. The third insulating interlayer 393 may be formed by a CVD process, a PECVD process, an ALD process, an HDP-CVD process, etc.

A third hole 394 may be formed through the third insulating interlayer 393 to expose the upper electrode 390. A third contact 396 may be formed on the upper electrode 390 to fill the third hole 394, and an upper wiring 399 may be formed on the third contact 396 and the third insulating interlayer 393. The third contact 396 and the upper metal wiring 399 may be integrally formed. The third contact 396 and the upper metal wiring 399 may be formed using tungsten, titanium, titanium nitride, aluminum, titanium aluminum nitride, tungsten nitride, aluminum nitride, doped polysilicon, etc.

Hereinafter, examples are explained in detail by comparison with a comparative example. However, the present invention is not limited to the examples, and various modifications are possible.

EXAMPLE 1

A phase-change material layer having about 97.5% by weight chalcogenide material and about 2.5% by weight nitrogen was formed by a sputtering process using a chalcogenide target having a chemical formula of $Ge_2Sb_2Te_5$. In the sputtering process, a power level of about 500 W was applied to the chalcogenide target, a substrate was maintained at a temperature of about 300° C., and argon gas having a flow rate of about 50 sccm and nitrogen gas having a flow rate of about 27 sccm were provided to the substrate. The chalcogenide material in the phase-change material layer included about 49% by weight tellurium.

EXAMPLE 2

Under the substantially same condition as Example 1, except that nitrogen gas having a flow rate of about 32 sccm was provided, a phase-change material layer having about 97.0% by weight of a chalcogenide material and about 3.0% by weight nitrogen was formed. The chalcogenide material in the phase-change material layer had about 47% by weight tellurium.

EXAMPLE 3

Under the substantially same condition as Example 1, except that nitrogen gas having a flow rate of about 37 sccm was provided, a phase-change material layer having about 96.4% by weight of a chalcogenide material and about 3.6% by weight nitrogen was formed. The chalcogenide material in the phase-change material layer had about 45% by weight tellurium.

EXAMPLE 4

Under the substantially same condition as Example 1, except that nitrogen gas having a flow rate of about 37 sccm was provided, a phase-change material layer having about 93.2% by weight chalcogenide material and about 6.8% by weight nitrogen was formed. The chalcogenide material in the phase-change material layer had about 30% by weight tellurium.

COMPARATIVE EXAMPLE

Under the substantially same condition as Example 1, except that no nitrogen gas was provided, a phase-change material layer having a chalcogenide material that included about 56% by weight tellurium was formed.

Evaluation of a Composition Ratio of a Phase-Change Material Layer

Figure 15:
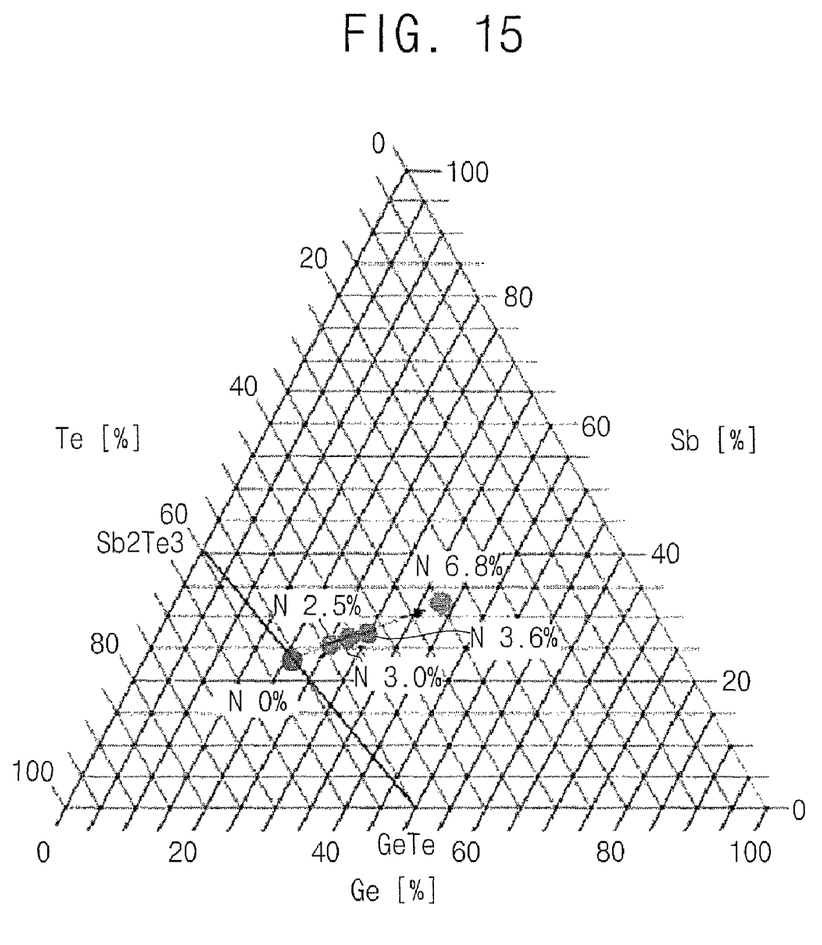
FIG. 15 is a diagram illustrating nitrogen contents and composition ratios of the chalcogenide materials in the phase-change material layers presented in Examples 1, 2, 3, and 4 and the Comparative Example, respectively.

FIG. 15 is a diagram illustrating nitrogen contents and composition ratios of the chalcogenide materials in the phase-change material layers in Examples 1, 2, 3, and 4 and Comparative Example, respectively. The nitrogen contents and the composition ratios were measured by an X-ray fluorescent analyzer.

Referring to FIG. 15, the chalcogenide material in Example 1 had a composition ratio of about 1:1:1.9 among germanium, antimony and tellurium. The chalcogenide material had about 49% by weight tellurium. The chalcogenide material in Example 2 had a composition ratio of about 1:1:1.8 among germanium, antimony and tellurium. The chalcogenide material had about 47% by weight tellurium. The chalcogenide material in Example 3 had a composition ratio of about 1:1:1.6 among germanium, antimony and tellurium. The chalcogenide material had about 45% by weight tellurium. The chalcogenide material in Example 4 had a composition ratio of about 1:1:1 among germanium, antimony and tellurium. The chalcogenide material had about 30% by weight tellurium. The chalcogenide material in the Comparative Example had a composition ratio of about 1:1:2.5 among germanium, antimony and tellurium. The chalcogenide material had about 56% by weight tellurium.

Thus, when a phase-change material layer is formed by a sputtering process at a temperature of about 300° C. at which tellurium may be volatilized with an increasing flow rate of nitrogen gas, the phase-change material layer may have an increased nitrogen content and a decreased tellurium content to a degree of about 36% by weight.

Evaluation of Reliability of a Phase-Change Material Layer

Figure 16:
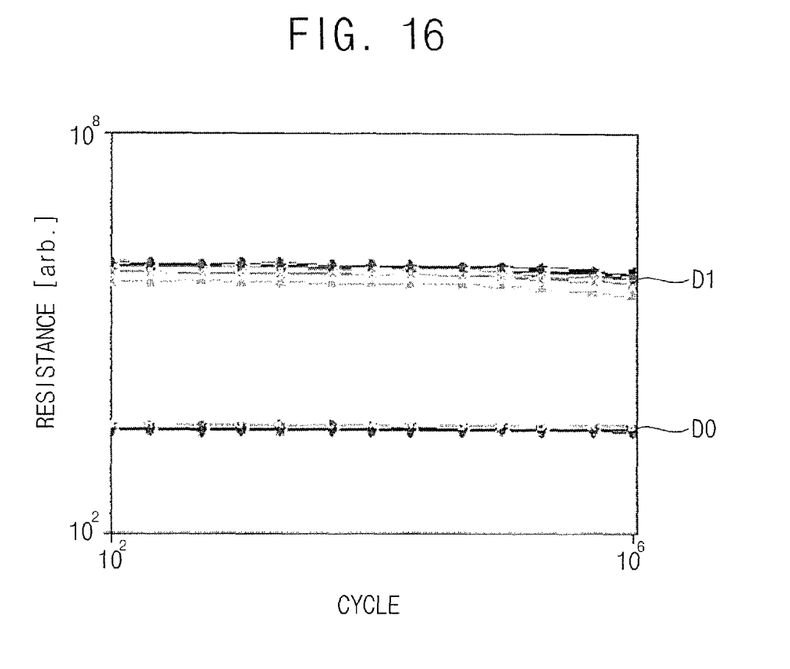
FIG. 16 is a graph illustrating endurance characteristics of a memory cell including the phase-change material layer presented in Example 3.

FIG. 16 is a graph illustrating endurance characteristics of a memory cell including the phase-change material layer in Example 3. In FIG. 16, the x-axis indicates the number of overwrite cycles of the memory cell, and the y-axis indicates resistances of the memory cell in an amorphous state D1 and in a crystalline state D0, respectively.

Referring to FIG. 16, the memory cell including the phase-change material layer in Example 3 had a constant resistance before performing about $2\times10^5$ cycles of operations, whereas the memory cell including the phase-change material layer in the Comparative Example had a constant resistance before performing about $1\times10^5$ cycles of operations. Thus, the memory cell including the phase-change material layer in Example 3 has desirable endurance characteristics.

Figure 17:
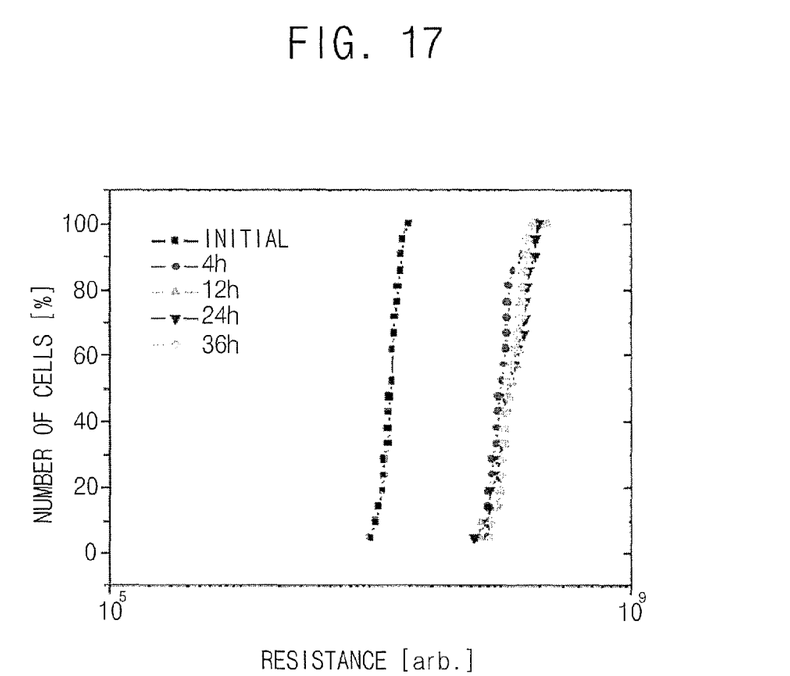
FIG. 17 is a graph illustrating data retention characteristics of a memory cell including the phase-change material layer presented in Example 3.

FIG. 17 is a graph illustrating data retention characteristics of a memory cell including the phase-change material layer in Example 3.

Referring to FIG. 17, the memory cell including the phase-change material layer in Example 3 had desirable data retention characteristics after performing heat treatments at a temperature of about 130° C. for 4 hours, 12 hours, 24 hours and 36 hours, respectively. In this instance, if the memory cell maintains data at the temperature of about 130° C. for 36 hours, the memory cell may maintain the data at a temperature of about 90° C. for about 10 years.

According to some embodiments of the invention, a sputtering process is performed using argon gas and nitrogen gas at a temperature at which only tellurium may be volatilized to form a phase-change material layer having impurities and a chalcogenide material including about 30 to about 50% by weight tellurium. The phase-change material layer may have below about 50% by weight tellurium, so that the phase-change material layer may have desirable electrical characteristics.

The foregoing is illustrative of the present invention and is not to be construed as limiting thereof, and modifications to the disclosed embodiments, as well as other embodiments, are intended to be included within the scope of the appended claims. The present invention is defined by the following claims, with equivalents of the claims to be included therein.

What is claimed is:

1. A method of forming a phase-change material layer, comprising:

providing a substrate and a chalcogenide target comprising germanium (Ge), antimony (Sb) and tellurium (Te) at a temperature wherein tellurium is volatilized and antimony is not volatilized; and performing a sputtering process to form the phase-change material layer comprising a chalcogenide material on the substrate.

2. The method of claim 1, wherein the chalcogenide material comprises about 5 to about 50% by weight tellurium.

3. The method of claim 1, wherein the tellurium content is less than about 50% by weight.

4. The method of claim 1, wherein the temperature is in a range of about 250 to about 350° C.

5. The method of claim 1, wherein the chalcogenide material comprises at least one selected from the group consisting of germanium-antimony-tellurium (Ge—Sb—Te), arsenic-antimony-tellurium (As—Sb—Te), arsenic-germanium-antimony-tellurium (As—Ge—Sb—Te), tin-antimony-tellurium (Sn—Sb—Te), indium-antimony-tellurium (In—Sb—Te), silver-indium-antimony-tellurium (Ag—In—Sb—Te), an element in Group 15-antimony-tellurium (Group 15 element-Sb—Te), and an element in Group 16-antimony-tellurium (Group 16 element-Sb—Te).

6. The method of claim 1, wherein performing the sputtering process comprises:
depositing particles of the chalcogenide target on the substrate to form a preliminary chalcogenide material; and
volatilizing at least some portions of tellurium included in the preliminary chalcogenide material to form a subsequent chalcogenide material comprising about 5 to about 50% by weight tellurium.

7. The method of claim 1, wherein the chalcogenide target is $Ge_2Sb_2Te_5$.

8. The method of claim 1, wherein the chalcogenide target comprises a first target comprising germanium telluride (GeTe) and a second target comprising antimony telluride ($Sb_2Te_3$).

9. The method of claim 1, wherein the chalcogenide material comprises about 25 to about 35% by weight germanium, 25 to about 35% by weight antimony, and about 30 to about 50% by weight tellurium.

10. The method of claim 1, wherein the chalcogenide target further comprises impurities comprising at least one selected from the group consisting of oxygen (O), silicon (Si) and carbon (C).

11. The method of claim 10, wherein the phase-change material layer comprises about 86 to about 98% by weight chalcogenide material, wherein the chalcogenide material comprises about 25 to about 35% by weight germanium, about 25 to about 35% by weight antimony, about 30 to about 50% by weight tellurium, and about 2 to about 14% by weight impurities.

12. The method of claim 1, wherein performing the sputtering process comprises:
introducing argon gas and nitrogen gas into an environment having the substrate and the chalcogenide target; and
exciting the argon gas and the nitrogen gas to a plasma state.

13. The method of claim 12, wherein the argon gas and nitrogen gas have a flow rate ratio of about 1:0.3 to about 1:2.0.

14. The method of claim 11, wherein the phase-change material layer comprises about 90 to about 98% by weight chalcogenide material, wherein the chalcogenide material comprises about 25 to about 35% by weight germanium, about 25 to about 35% by weight antimony, about 30 to about 50% by weight tellurium, and about 2 to about 10% by weight nitrogen.

15. The method of claim 1, wherein the phase-change material layer is formed to a thickness of about 70 to about 120 nm.

16. A method of manufacturing a phase-change memory device, comprising:
forming a lower electrode on a substrate in a chamber having a chalcogenide target therein, wherein the chalcogenide target comprises germanium, antimony and tellurium;
providing a temperature wherein tellurium is volatilized and antimony is not volatilized;
performing a sputtering process to form a phase-change material layer comprising a chalcogenide material on the substrate; and
forming an upper electrode on the phase-change material layer.

17. The method of claim 16, wherein the chalcogenide material comprises about 5 to about 50% by weight tellurium.

18. The method of claim 16, wherein the temperature is in a range of about 250 to about 350° C.

19. The method of claim 16, wherein the chalcogenide target comprises a first target comprising germanium telluride (GeTe) and a second target comprising antimony telluride ($Sb_2Te_3$).

20. The method of claim 16, wherein the chalcogenide target further comprises impurities comprising at least one selected from the group consisting of oxygen (O), silicon (Si) and carbon (C).

* * * * *